(12) United States Patent  (10) Patent No.: US 9,320,170 B2
Sunaga et al.  (45) Date of Patent: Apr. 19, 2016

(54) COMMUNICATION MODULE-COOLING STRUCTURE AND COMMUNICATION DEVICE

(71) Applicant: Hitachi Metals, Ltd., Tokyo (JP)

(72) Inventors: Yoshinori Sunaga, Hitachinaka (JP); Yoshiaki Ishigami, Hitachi (JP); Kinya Yamazaki, Hitachi (JP); Hidenori Yonezawa, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 245 days.

(21) Appl. No.: 13/943,905

(22) Filed: Jul. 17, 2013

(65) Prior Publication Data

US 2014/0063740 A1 Mar. 6, 2014

(30) Foreign Application Priority Data

Sep. 3, 2012 (JP) ................................ 2012-193380

(51) Int. Cl.
*H05K 7/20* (2006.01)
*H01L 23/473* (2006.01)
*G02B 6/42* (2006.01)

(52) U.S. Cl.
CPC .......... *H05K 7/20254* (2013.01); *G02B 6/4269* (2013.01); *H01L 23/473* (2013.01); *G02B 6/4214* (2013.01); *H01L 2924/0002* (2013.01)

(58) Field of Classification Search
CPC ............ H01L 23/427; H01L 2023/405; H01L 2023/4062; H01L 23/473; G06F 1/20; G06F 2200/201; H05K 7/20254; H05K 7/20154; H05K 7/209; F28D 2021/0029
See application file for complete search history.

(56) References Cited

U.S. PATENT DOCUMENTS 6,118,662 A * 9/2000 Hutchison et al. ........... 165/80.3

FOREIGN PATENT DOCUMENTS

| EP | 0580412 | 1/1994 |
| JP | 06-177570 | 6/1994 |
| JP | 2011-128378 | 6/2011 |

OTHER PUBLICATIONS

JP Office Action dated Dec. 2, 2015 and English translation of Notice of Reasons for rejection.

* cited by examiner

*Primary Examiner* — Robert J Hoffberg
*Assistant Examiner* — Hung Dang
(74) *Attorney, Agent, or Firm* — Roberts Mlotkowski Safran & Cole, PC

(57) ABSTRACT

A communication module-cooling structure includes a main body section to be cooled by a cooling mechanism, and a heat sink including a cooling receiving section including partition walls and slit-shaped receiving spaces defined by the partition walls. The receiving spaces of the cooling receiving section receive communication modules, and each of the communication modules includes a substrate mounted with a communication circuit component thereon and first and second sidewalls which sandwich the substrate therebetween in a thickness direction of the substrate. At least one of the first and second sidewalls of each of the communication modules is in surface contact with an inner surface of each of the receiving spaces.

8 Claims, 8 Drawing Sheets

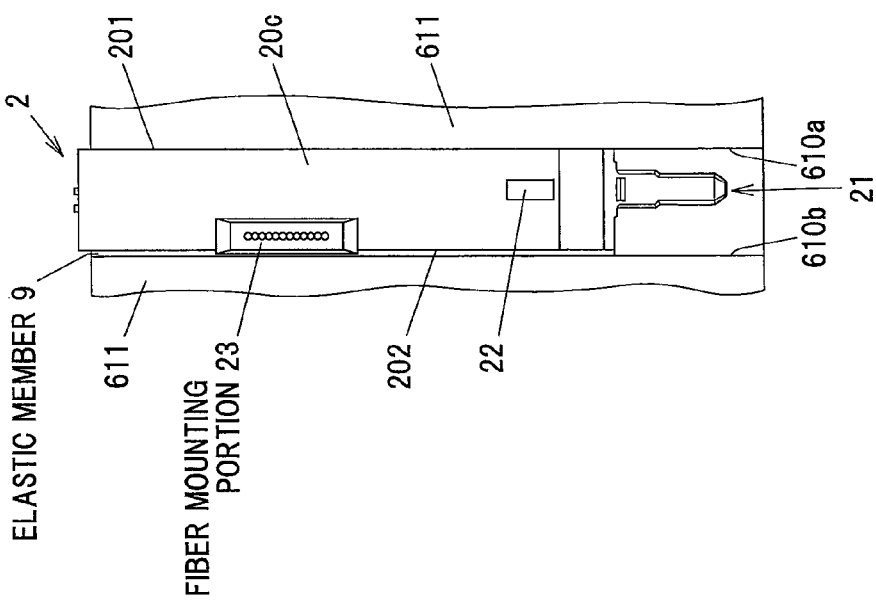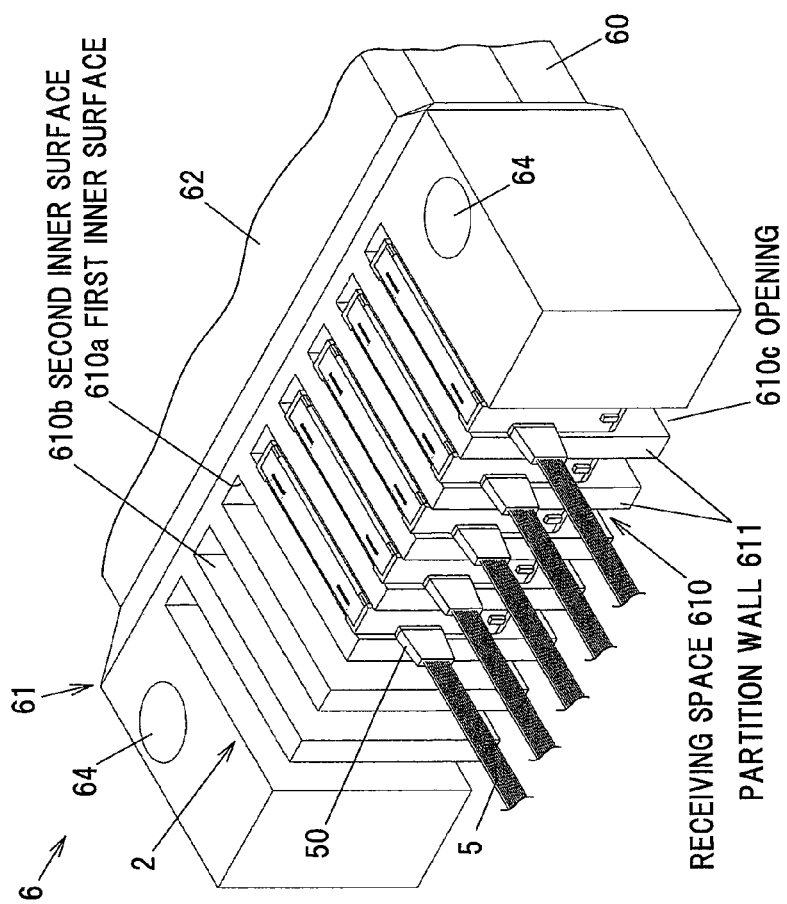

COMMUNICATION MODULE-COOLING STRUCTURE AND COMMUNICATION DEVICE

The present application is based on Japanese patent application No. 2012-193380 filed on Sep. 3, 2012, the entire contents of which are incorporated herein by reference.

BACKGROUND OF THE INVENTION

1. Field of the Invention

This invention relates to a communication module-cooling structure for use in signal transmission in e.g. high-performance servers, high-speed network devices, and a communication device provided with communication modules and a cooling structure therefor.

2. Description of the Related Art

Conventionally, in order to increase the mounting efficiency of electronic components on a mother board, a communication device in which e.g. a card-like optical communication module (optical module) is arranged perpendicular to a mother board has been known. The communication module of this type is provided with a heat sink to dissipate heat produced by an optical element, a control IC or the like mounted on a substrate thereof, and to suppress a temperature rise (see e.g., JP-A-2011-128378).

The communication module disclosed in JP-A-2011-128378 has a rigid substrate formed with a terminal at its end, and the terminal is electrically connected by mating to a connector socket mounted on the mother board. This rigid substrate is arranged perpendicular to the mother board. A mounting surface of the rigid substrate is mounted with an optical element, a control IC or the like thereon, while a non-mounting surface opposite to the mounting surface is attached with the heat sink. The heat produced by the optical element, control IC or the like thermally conducts via the rigid substrate to the heat sink and will be dissipated from fins formed on the heat sink.

Refer to JP-A-2011-128378, for example.

SUMMARY OF THE INVENTION

Now, in accordance with the enhancement in performance of servers, network devices, etc. in recent years, further high-density mounting of electronic components is required. Therefore, there may be the need to arrange a plurality of communication modules close to each other, for example. However, when placing the communication modules disclosed in JP-A-2011-128378 close to each other, the heat cannot be dissipated sufficiently due to lowering in airflow to the fins of the heat sink. Further, since the entire heat sink including the fins are interposed between the substrates of the adjacent communication modules, the distance between the substrates cannot be shorter than the thickness of the heat sink. This can interfere with high-density mounting.

Accordingly, an object of the present invention is to provide a communication module-cooling structure and a communication device, capable of efficiently dissipating heat produced from communication modules, even when the communication modules are arranged at high density.

(1) According to a feature of the invention, a communication module-cooling structure comprises:

a main body section to be cooled by a cooling mechanism; and a heat sink including a cooling receiving section comprising partition walls and slit-shaped receiving spaces defined by the partition walls;

wherein the receiving spaces of the cooling receiving section receive communication modules, each of the communication modules including a substrate mounted with a communication circuit component thereon and first and second sidewalls which sandwich the substrate therebetween in a thickness direction of the substrate, wherein at least one of the first and second sidewalls of each of the communication modules is in surface contact with an inner surface of each of the receiving spaces.

(i) It is preferable that at least the first sidewall is in surface contact with the inner surface of each of the receiving spaces, wherein temperature rise of the first sidewall is greater than temperature rise of the second side wall.

(ii) The heat sink may include a heat absorbing surface for absorbing heat of a semiconductor IC that is electrically connected to the communication modules.

(iii) The cooling mechanism may include a coolant passage, which faces the main body section of the heat sink, a pump for circulating coolant water to the passage, and a radiator for cooling the coolant water.

(iv) The communication module-cooling structure may further comprise a thermally conductive elastic member interposed between the inner surface of each of the receiving spaces and the second sidewall of the communication modules, wherein temperature rise of the second sidewall is smaller than temperature rise of the first sidewall.

(v) The communication module-cooling structure may further comprise:

a mother board to which the heat sink is fixed; and connectors to which the communication modules are mated, respectively, wherein the connectors are mounted on the mother board, and each of the receiving spaces is open in both directions perpendicular to the mother board, and in one direction parallel to the mother board.

(vi) The semiconductor IC may comprise a plate shaped semiconductor package substrate and an IC chip mounted on the semiconductor package substrate, and the semiconductor package substrate is mounted with connectors to which the communication modules are mated.

(vii) The communication circuit component may include an optical element which is optically coupled to an optical fiber, and a semiconductor circuit element which is electrically connected to the optical element, and at least the first sidewall of each of the communication modules is in surface contact with an inner surface of the cooling receiving section, where temperature rise of the first sidewall is greater due to heat produced by the semiconductor circuit element and the optical element than temperature rise of the second side wall.

(2) According to another embodiment of the invention, a communication device comprises:

a main body section cooled by a cooling mechanism;

a heat sink including a cooling receiving section comprising partition walls and slit-shaped receiving spaces defined by the partition walls;

a substrate mounted with a communication circuit component thereon; and communication modules, each of which includes first and second sidewalls which sandwich the substrate therebetween in a thickness direction of the substrate, wherein the communication modules are received in the receiving spaces of the cooling receiving section of the heat sink, and at least one of the first and second sidewalls is in surface contact with an inner surface of each of the receiving spaces.

Points of the Invention

With the communication module-cooling structure and the communication device according to the present invention, it is possible to mount the communication modules on a substrate at high density, and more efficiently dissipate heat produced from the communication modules.

BRIEF DESCRIPTION OF THE DRAWINGS

The preferred embodiments according to the invention will be explained below referring to the drawings, wherein:

FIGS. 4A and 4B are a perspective view and a partial side view showing a portion of a heat sink;

DETAILED DESCRIPTION OF THE PREFERRED EMBODIMENT

Embodiment

Figure 1:
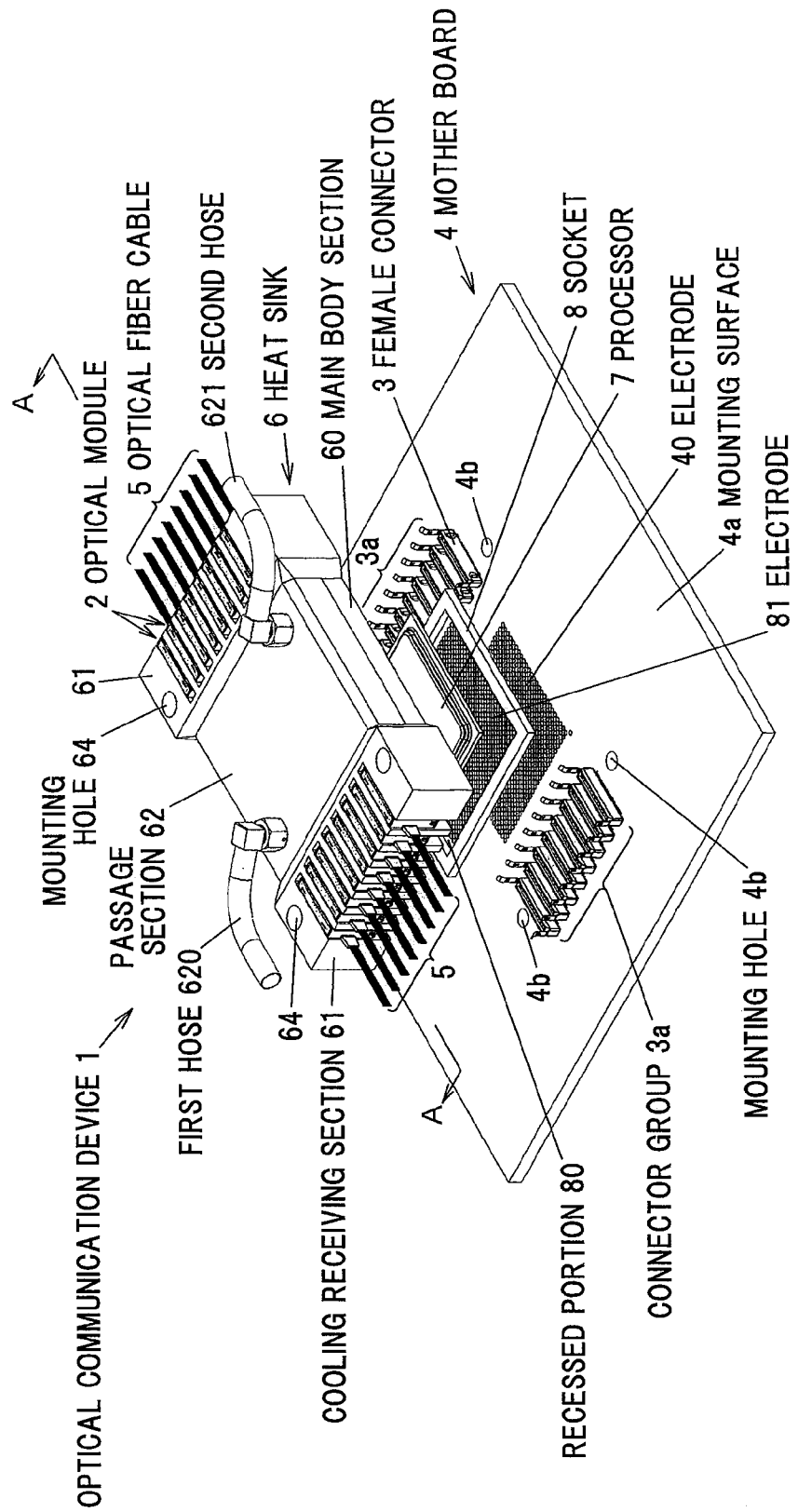
FIG. 1 is an exploded perspective view showing a configuration example of an optical communication device as a communication device in the present embodiment.

FIG. 1 is an exploded perspective view showing a configuration example of an optical communication device 1 as a communication device in an embodiment of the present invention.

The optical communication device 1 is configured as including a plurality (sixteen in this embodiment) of optical modules 2 as communication modules, a processor 7 as a semiconductor IC that is electrically connected to the optical modules 2, a mother board 4 mounted with the processor 7 and the optical modules 2, and a heat sink 6 for cooling the optical modules 2. A plurality of optical fiber cables 5 are connected to the plurality of optical modules 2, respectively. In the peripheral portion of the optical modules 2, the plurality of the optical fibers 5a extend in a direction parallel to the mother board 4.

The mother board 4 is, e.g., a glass epoxy substrate with a wiring pattern formed by pasting a plurality of copper foils to a plate shape substrate formed by thermosetting epoxy resin-impregnated glass fibers and etching these copper foils. The mother board 4 is mounted with electronic components such as a CPU (Central Processing Unit) (not shown), a memory element (not shown), etc. in addition to the processor 7 and the optical modules 2. By optical communication using the optical fibers 5a mounted to the optical modules 2 as a transmission medium, a signal is transmitted or received between it and another electronic circuit board or an electronic device.

In this embodiment, a mounting surface 4a of the mother board 4 is mounted with a plurality (sixteen in this embodiment) of female connectors 3 mated with the optical modules 2 and a socket 8 which holds the processor 7. The socket 8 is formed with a recessed portion 80 mated with the processor 7. In the recessed portion 80, a plurality of electrodes 81 are arranged in a grid pattern, and are electrically connected to a plurality of electrodes (not shown) formed on a bottom surface of the processor 7. The mother board 4 and the socket 8 are electrically connected together via a plurality of electrodes 40 that are mounted on the mounting surface 4a of the mother board 4.

The sixteen female connectors 3 constitute one pair of connector groups 3a on the mounting surface 4a of the mother board 4. Each connector group 3a is constituted from eight aligned female connectors 3. One connector group 3a is located opposite the other connector group 3a. The sixteen optical modules 2 correspond to the one pair of the connector groups 3a, and are constituted from one pair of the eight optical modules 2. The one pair of the eight optical modules 2 are arranged parallel to the mounting surface 4a of the mother board 4 in accordance with the arrangement of the one pair of the connector groups 3a. The processor 7 and the socket 8 are arranged between the one connector group 3a and the other connector group 3a.

The heat sink 6 integrally (e.g. as one piece) includes one pair of cooling receiving sections 61, each of which is formed with a plurality of slit-shaped receiving spaces 610 (to be described later) to receive the plurality of optical modules 2, and a plate shaped main body section 60 to interlock the pair of the cooling receiving sections 61. An upper surface (surface opposite to the mother board 4) of the main body section 60 is provided with a passage section 62 which constitutes a passage of the coolant water for cooling the heat sink 6.

To the passage section 62 are connected a first hose 620 for discharging the coolant water from the passage section 62, and a second hose 621 for feeding the coolant water into the passage section 62. The heat sink 6 is fixed to the mother board 4 by four bolts (not shown) which penetrates a mounting hole 64 formed in an upper surface of both the cooling receiving sections 61, and four mounting holes 4b formed at both ends of the connector groups 3a of the mother board 4, and nuts which are screwed onto these bolts, respectively. When the heat sink 6 is fixed, the processor 7 and the socket 8 and the female connector 3 are sandwiched between the heat sink 6 and the mother board 4.

Figure 2:
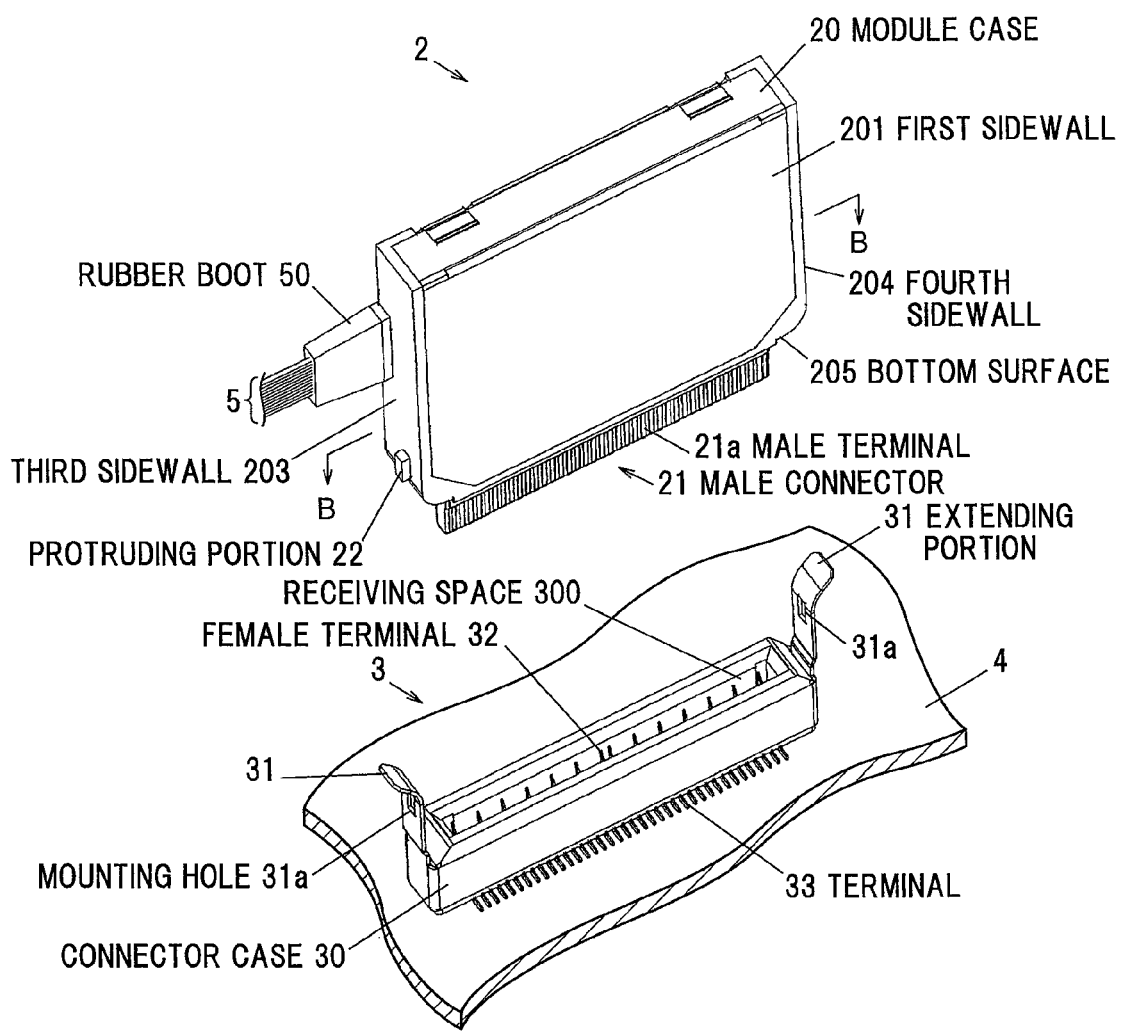
FIG. 2 is a perspective view of an optical module and a connector.

FIG. 2 is a perspective view of the optical module 2, and the female connector 3.

The optical modules 2 includes a module case 20 including a first sidewall 201 and a second sidewall 202 as one pair of sidewalls which sandwich the substrate therebetween in a thickness direction of the substrate mounted with a later described communication circuit component thereon. A bottom surface 205 of a module case 20 that faces the mounting surface 4a of the mother board 4 is provided with a male connector 21 that is mated to the female connector 3. The male connector 21 is formed with a plurality of male terminals 21a in an extending direction of the optical fiber cable 5.

Further, the module case 20 includes a third sidewall 203 that is provided in a normal direction to the mounting surface 4a of the mother board 4 and between one end of the first sidewall 201 and one end of the second sidewall 202, and a fourth sidewall 204 that is provided opposite the third sidewall 203 and between the other end of the first sidewall 201 and the other end of the second sidewall 202. The third sidewall 203 and the fourth sidewall 204 are formed with one pair of protruding portions 22 (only one protruding portion 22 shown in FIG. 2) which are mated to the one pair of the mounting holes 31a respectively formed in the female connector 3. Further, the third sidewall 203 is attached with a rubber boot 50 of the optical fiber cable 5.

The module case 20 is e.g. 23 mm in entire length along the extending direction of the optical fiber cable 5, and is e.g. 3.6 mm in the thickness direction dimension orthogonal to the extending direction. The height direction (direction perpendicular to the mother board 4) dimension of the optical modules 2 is e.g., 24 mm.

The female connector 3 includes a connector case 30 formed with a receiving space 300 for receiving the plurality of the female terminals 32 which are electrically connected to the plurality of the male terminals 21a and an extending portion 31 which extends in the mating direction of the female connector 3 and the male connector 21 from the connector case 30. The extending portion 31 is in contact with the third sidewall 203 and the fourth sidewall 204 of the module case 20. The extending portion 31 is formed with a rectangular mounting hole 31a which engages the protruding portion 22 formed on the third sidewall 203 and the fourth sidewall 204. A bottom surface opposite the mounting surface 4a of the mother board 4 of the connector case 30 is formed with a plurality of terminals 33 which are formed in the extending direction of the optical fiber cable 5. The plurality of the terminals 33 are connected by soldering to the mounting surface 4a of the mother board 4.

Figure 3:
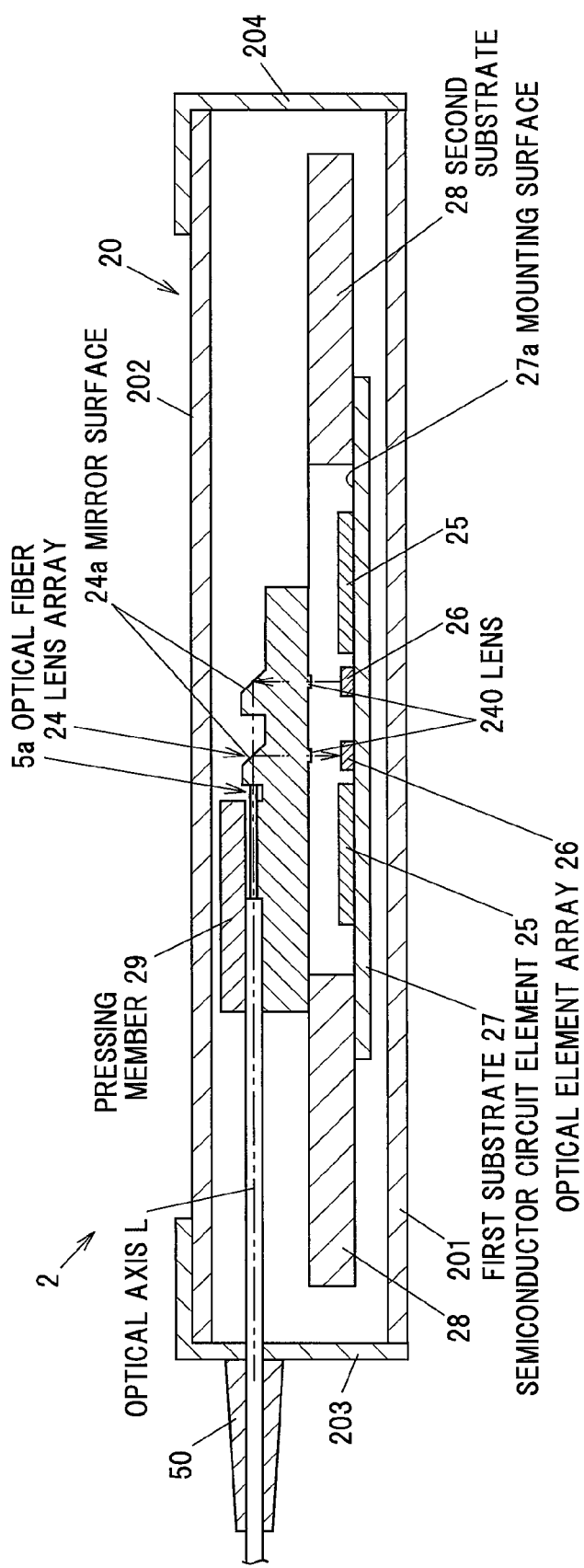
FIG. 3 is a cross sectional view taken along line B-B in FIG. 2 showing the optical module.

FIG. 3 is a cross sectional view taken along line B-B in FIG. 2 showing the optical modules 2.

The optical module 2 comprises a first substrate 27, one pair of optical element arrays 26 with a plurality of optical elements arranged therein, one pair of semiconductor circuit elements 25 which are electrically connected to the one pair of the optical element arrays 26, a lens array 24 for optically coupling the optical fiber 5a and the element arrays 26 and a second substrate 28 which is sandwiched between the first substrate 27 and the lens array 24, all of which are received in the module case 20. The first substrate 27 is disposed on the side of the first sidewall 201 in the module case 20, and the lens array 24 is disposed on the side of the second sidewall 202 in the module case 20. The mounting surface 27a of the substrate 27 is mounted with the one pair of the optical element arrays 26, and the one pair of the first semiconductor circuit elements 25. The one pair of the semiconductor circuit elements 25 are disposed to locate the one pair of the optical element arrays 26 therebetween. The optical fiber 5a is located on the sidewall 202 side with respect to the second lens array 24 and is pressed against the lens array 24 by a pressing member 29.

The optical element is an element that converts electrical energy to light, or converts light to electrical energy. As the former light-emitting element, there are listed e.g. a laser diode, a VCSEL (Vertical Cavity Surface Emitting LASER), and the like. Further, as the latter light receiving element, there are listed a photodiode and the like. The optical elements are configured to emit or receive light to or in the lens array 24.

When the optical element is an element for converting electric energy to light, the semiconductor circuit element 25 is a driver IC for driving the optical elements based on an electric signal inputted from the mother board 4 side. Further, when the optical element is an element that converts light which the optical elements receive into electric energy, the semiconductor circuit element 25 is a preamplifier IC that amplifies an electrical signal input from the optical elements and outputs it to the side of the mother board 4.

Incidentally, in this embodiment, one optical element array 26 is a light emitting element, while the other optical element array 26 is a light-receiving element. Therefore, for the semiconductor circuit elements 25, one semiconductor circuit element 25 is a driver IC, while the other semiconductor circuit element 25 is a preamplifier IC.

The lens array 24 is formed with a plurality of lenses 240 in correspondence to the plurality of the optical elements at positions opposite to the optical element arrays 26. The light (optical axis L) emitted from the optical elements of the optical element arrays 26 is collimated by the lenses 240, reflected at a mirror surface 24a of the lens array 24, and received in a core of the optical fiber 5a. Further, the light (optical axis L) emitted from the core of the optical fiber 5a is reflected at the mirror surface 24a, collimated by the lenses 240, and received in the optical elements.

Each of optical element arrays 26 and the semiconductor circuit elements 25 is a heating element that emits heat by operation thereof. This heat is dissipated primarily from the second sidewall 202 and the first sidewall 201 of the module case 20. In comparison with the second sidewall 202, the first sidewall 201 is short in distance from the semiconductor circuit elements 25 and the optical element arrays 26. Therefore, the temperature rise of the first sidewall 201 due to heat produced by the semiconductor circuit elements 25 and the optical element arrays 26 is greater than the temperature raise of the second sidewall 202.

The optical modules 2 are cooled by a cooling structure using the heat sink 6. Then, the cooling structure for cooling the optical module 2 will be explained in more detail.

FIGS. 4A and 4B are a perspective view and a partial side view showing a portion of the heat sink 6.

In this embodiment, a cooling receiving section 61 of the heat sink 6 is formed with eight slit-shaped receiving spaces 610 in which the eight optical modules 2 corresponding to the connector group 3a are received, respectively. The cooling receiving section 61 has a plurality (seven) of partition walls 611 that separate (i.e. define) the adjacent receiving spaces 610. The partition walls 611 are formed parallel to each other between the eight receiving spaces 610. That is, the plurality of the receiving spaces 610 are formed between the plurality of the partition walls 611. The receiving spaces 610 are open in one direction parallel to the mother board 4 and in both directions perpendicular to the mother board 4.

The optical fibers 5a extend outwardly from an opening 610c of the receiving spaces 610 which is formed on the opposite side to the main body section 60 of the heat sink 6. The third sidewall 203 of the optical modules 2 is provided with a fiber mounting portion 23 which engages the rubber boot 50 of the optical fiber 5a.

As shown in FIG. 4B, the first sidewall 201 of the optical modules 2 is in surface contact with one inner surface of one pair of mutually opposing inner surfaces of the receiving spaces 610. In the following description, it is assumed that the one pair of the inner surfaces, the inner surface in surface contact with the first sidewall 201 is a first inner surface 610a and the other inner surface facing parallel to the first inner surface 610a is a second inner surface 610b. Between the second inner surface 610b and the second sidewall 202 of the optical modules 2, a thermally conductive elastic member 9 is interposed. By the biasing force of the elastic member 9, the first sidewall 201 of the optical modules 2 is pressed against the first inner surface 610a of the receiving spaces 610.

Figure 5:
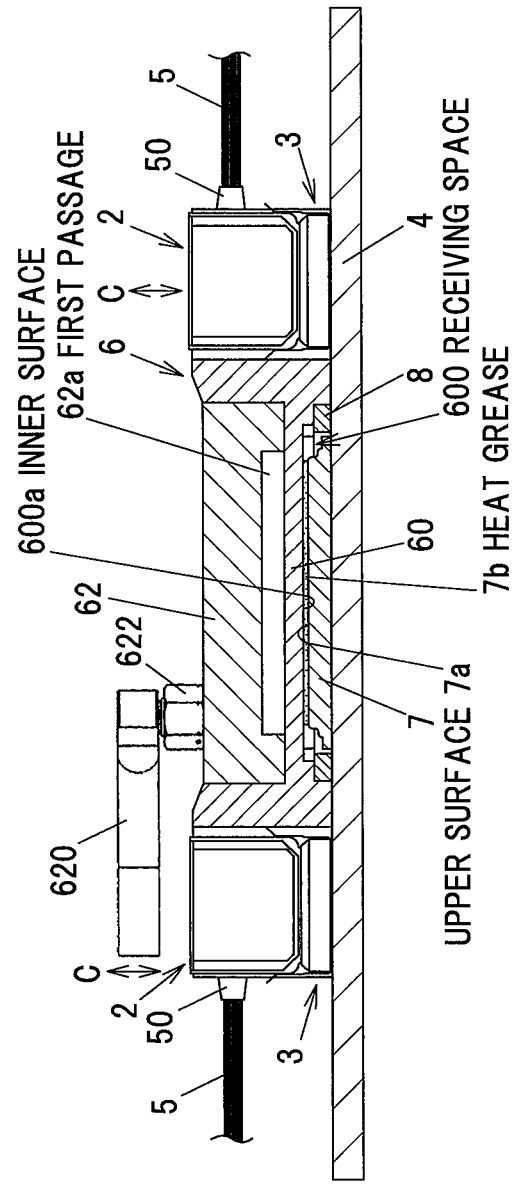
FIG. 5 is a cross sectional view taken along line A-A in FIG. 1.

FIG. 5 is a cross sectional view taken along line A-A in FIG. 1.

When the heat sink 6 is attached to the mother board 4, the receiving spaces 600 are formed between the mounting surface 4a of the mother board 4 and the main body section 60 of the heat sink 6. The socket 8 and the processor 7 are received in the receiving spaces 600. Between the processor 7 and the main body section 60, a gap is formed and a heat grease 7b to fill the gap is interposed. The heat grease 7b is in close contact with the inner surface 600a as a heat absorbing surface of the receiving spaces 600 and an upper surface 7a of the processor 7.

Then, the procedure for attaching and detaching the optical module 2 to and from the female connector 3 will be explained.

In the case of mounting the optical module 2 to the female connector 3, the optical module 2 mounted with the elastic member 9 is inserted into the receiving space 610 from a direction perpendicular to the mother board 4, and is mated into the female connector 3. When taking the optical module 2 out from the receiving space 610, after detaching the projecting portion 22 of the optical module 2 from the mounting hole 31*a* of the female connector 3, the optical module 2 is drawn out from the receiving space 610 in a direction perpendicular to the mother board 4. In other words, the optical module 2 is attached and detached in both arrow C directions in FIG. 5.

Between the surfaces facing each other of the passage section 62 and the main body section 60 of the heat sink 6 is formed a first passage 62*a* which is a space which constitutes a passage in which coolant water is circulated. The coolant water flows into the passage section 62 from the second hose 621 (shown in FIG. 1), flows through a first passage 62*a* facing the passage section 62 and the main body section 60, and is discharged to the outside of the passage section 62 from the first hose 620. The first hose 620 and the second hose 621 are attached to the upper surface of the passage section 62 with a nut 622. The cooling water discharged from the first hose 620 flows through the second passage 12, which will be described later in the outside of the heat sink 6 and flows from the second hose 621 again into the passage section 62.

In the process of coolant water flowing through the first passage 62*a*, the main body section 60 is cooled by the coolant water. That is, the heat produced in the heat source (semiconductor circuit elements 25 and the optical element arrays 26) of the optical module 2 is transferred mainly to the first sidewall 201 of the module case 20, and further is transferred from the first sidewall 201 to the partition walls 611 of the cooling receiving section 61 through the first inner surface 610*a* of the receiving space 610. Further, another part of the heat produced by the heat source of the optical module 2 is transferred to the second sidewall 202 of the module case 20, and further is transferred from the second inner surface 610*b* of the receiving space 610 via the elastic member 9 to the partition walls 611 of the cooling receiving section 61. The heat transferred to the cooling receiving section 61 is transferred to the main body section 60, and is dissipated into the coolant water from the main body section 60.

The heat produced by the processor 7 is transferred to the heat grease 7*b* from the upper surface 7*a* of the processor 7. Then, the heat is transferred from the heat grease 7*b* to the main body section 60 of the heat sink 6 through the inner surface 600*a* of the receiving space 600, and is dissipated to the coolant water from the main body section 60.

Figure 6:
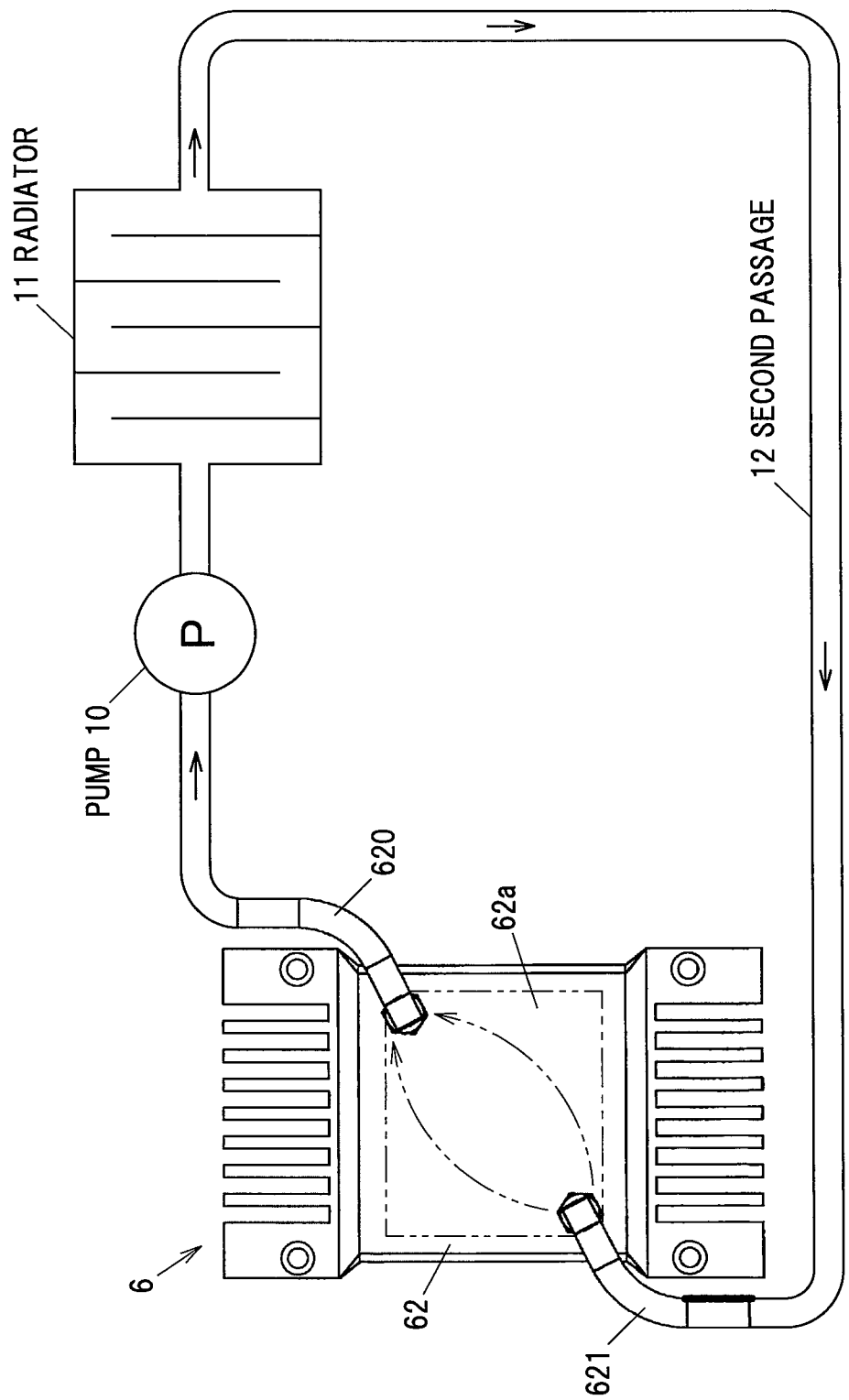
FIG. 6 is a schematic diagram showing a cooling mechanism.

FIG. 6 is a schematic diagram showing an exemplary configuration of a cooling mechanism for cooling the main body section 60 of the heat sink 6.

The cooling mechanism in this embodiment is configured to have a second passage 12 in the outside of the heat sink 6 and the first passage 62*a* facing the main body section 60 of the heat sink 6, a pump 10 for circulating the coolant water to the first and second passages 62*a*, 12, and a radiator 11 for cooling the coolant water.

The coolant water warmed by absorbing the heat from the processor 7 and the optical module 2 is sucked up by the pump 10 provided in the second passage 12, and is discharged to the second passage 12 from the first hose 620. The coolant water warmed is then cooled by the radiator 11 provided in the second passage 12. The cooling water cooled flows into the passage section 62 from the second hose 621 through the second passage 12. The cooling water flowing inside the passage section 62 flows like two-dot chain line in FIG. 6 in the first passage 62*a*. Thus, the coolant water is circulated through the first passage 62*a* and the second passage 12, and cools the heat sink 6.

Effects of the Embodiment

According to the embodiment which has been described above, it is possible to provide the following effects.

(1) The heat sink 6 includes the cooling receiving section 61 formed with the slit-shaped receiving spaces 610 provided between the partition walls 611. The heat produced by the optical modules 2 received in the receiving spaces 610 is transferred to the main body section 60 of the heat sink 6 from the partition walls 611, and is dissipated to the coolant water from the main body section 60. Thus, the heat dissipation from the optical modules 2 can be achieved by a single heat sink 6, so that it is not necessary to provide a heat dissipating portion such as fin for each of the optical modules 2. Although the plate shaped partition wall 611 is interposed between the adjacent optical modules 2, the thickness of the partition wall 611 is sufficient if the heat generated by the optical modules 2 can be transferred to the main body section 60. It is therefore possible to arrange the optical modules 2 at a higher density compared with a configuration in which the heat dissipating means is provided for each of the optical modules 2.

(2) By directly cooling by contacting with the first inner surface 610*a* of the receiving space 610 the first sidewalls 201 whose temperature rise due to heat produced by the optical modules 2 is high, the cooling efficiency is improved in comparison with e.g. the case of contacting only the second sidewall 202 with the inner surface (second inner surface 610*b*) of the receiving spaces 610.

(3) Since the optical modules 2 are in contact with only the first inner surface 610 and the second inner surface 610*b* in the receiving space 610 of the heat sink 6. Therefore, it is possible to attach and detach the individual optical modules 2 without removing the heat sink 6 from the mother board 4.

(4) Because the receiving spaces 610 of the heat sink 6 are open in one direction parallel to the mother board 4 and in both directions perpendicular to the mother board 4, the attaching and detaching the optical modules 2 to and from the receiving spaces 610 is facilitated. It is also possible to mount the optical fibers 5*a* to either surface of the third sidewall 203 or the upper surface of the module case 20.

(5) The heat sink 6 is in contact with the processor 7. By doing so, it is possible to cool the heat emanating from the processor 7 as well as the heat emanating from the optical modules 2. Since the heat generated by the optical modules 2 and the heat generated by the processor 7 are dissipated from a single common heat sink 6, the mounting positions of the optical modules 2 and the mounting position of the processor 7 become closer to each other, so that an electric wiring between the optical modules 2 and the processor 7 can be shortened. Accordingly, it is possible to suppress deterioration in signal transmission between the optical modules 2 and the processor 7.

(6) The heat sink 6 is cooled by the cooling mechanism by circulating coolant water. Therefore, it is possible to increase the cooling capability as compared with the case of cooling the heat sink by natural cooling or air cooling.

(7) The thermally conductive elastic member 9 is interposed between the second inner surface 610*b* of the receiving space 610 of the heat sink 6 and the second sidewall 202 of the optical module 2. Thus, the contact area increases by the first sidewall 201 whose temperature increase due to heat production is large being pressed against the first inner surface 610a of each of the receiving spaces 610. Further, the heat is transferred from the second side wall 202 to the partition wall 611 via the elastic member 9. Therefore, the optical module 2 cooling power of the heat sink 6 is further improved.

Incidentally, the optical communication device 1 in the embodiment is also possible to implement by modifying, for example, as follows.

(Modification 1)

Figure 7:
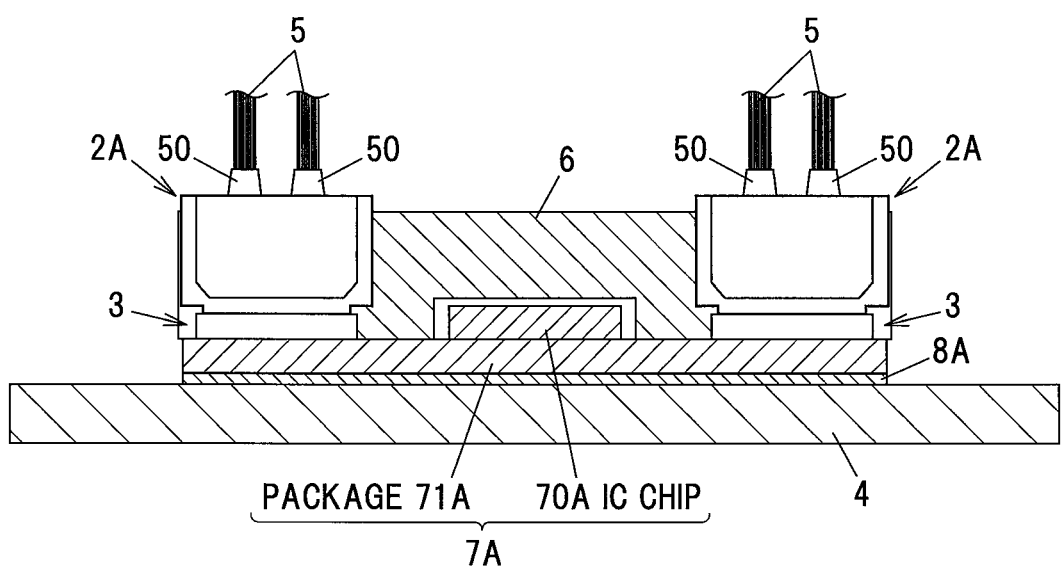
FIG. 7 is a schematic view showing a cross section of an optical communication device in modification 1 in a cross section corresponding to the A-A cross section in FIG. 1.

FIG. 7 is a schematic view showing a cross section of an optical communication device in modification 1 in a cross section corresponding to the A-A cross section in FIG. 1. In the drawings, common reference numerals are given for members having the same functions as those in the embodiment described earlier, and the duplicate description thereof will be omitted.

In the optical modules 2A in this modification, the rubber boot 50 of the optical fiber cable 5 is provided on an upper surface (opposite surface to the bottom surface 205) of the optical modules 2A. Thus, the optical fiber cable 5 extends in a direction perpendicular to the mother board 4. The processor 7A which is electrically connected to the optical modules 2A is constituted from an IC chip 70A and a package 71A as a semiconductor package substrate on which the IC chip 70A is mounted. The package 71A is mounted with, in addition to the IC chip 70A, the female connector 3, which is mated with the male connector 21 formed in the optical modules 2A.

This modification 1 has the following effects in addition to the effects (1) to (7) described in the embodiment.

By the female connector 3 being mounted on the package 71A of the processor 7A, the wiring of the optical modules 2A and the processor 7A is not required to pass through the mother board 4 and the socket 8A. Therefore, it is possible to shorten the connection distance between the processor 7A and the optical modules 2A, and suppress degradation in signal transmission.

(Modification 2)

Figure 8:
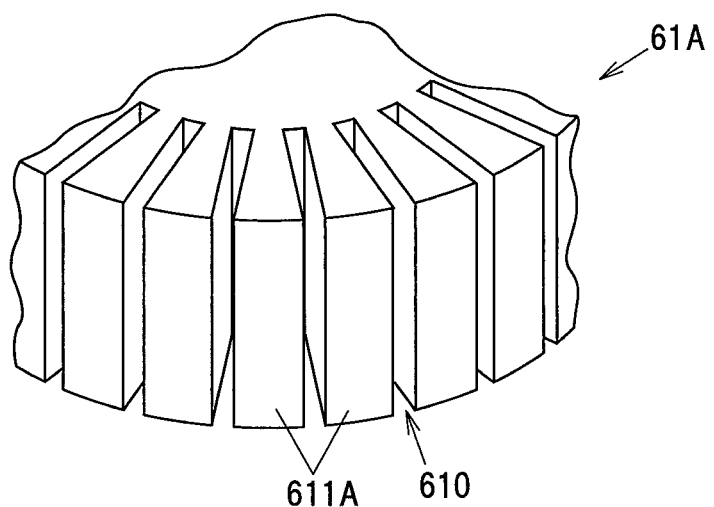
FIG. 8 is a diagram showing a portion of a cooling receiving section 61A of a heat sink 6A in modification 2.

FIG. 8 is a diagram showing a portion of a cooling receiving section 61A of a heat sink 6A in modification 2.

In the cooling receiving section 61A of the heat sink 6A, a plurality of slit shape receiving spaces 610 in which the optical modules 2 are received, and a plurality of partition walls 611A which separate the adjacent receiving spaces 610 are formed radially. That is, the plurality of the partition walls 611A are not parallel to each other, but are formed in a shape of a fan.

This modification 2 also has the similar effects to the effects (1) to (7) described in the embodiment.

Although the embodiment of the present invention has been described above, the embodiment described above is not intended to limit the invention in the appended claims. It should also be noted that not all the combinations of the features described in the above embodiment are essential to the means for solving the problems of the invention.

For example, although in the above-described embodiment it has been described that the communication module is the optical modules 2, 2A which perform optical communication via the optical fiber cable 5, the present invention is not limited thereto, but may also be applied to a communication module which perform communication through differential signal lines, e.g.

Further, the number of the optical modules 2, 2A which are received in the receiving spaces 610 may be not one, but two. In this case, it is preferable to interpose an elastic member 9 between the two optical modules 2, 2A.

Further, the cooling mechanism may use not coolant water, but air cooling. That is, the configuration of the cooling mechanism itself is not particularly limited.

Further, the passage section 62 may be attached to the upper side of the cooling receiving section 61 of the heat sink 6.

There is no limit on the number of the optical modules 2.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A communication module-cooling structure, comprising:
   a heat sink including a pair of cooling receiving portions each comprising partition walls and slit-shaped receiving spaces defined by the partition walls, and
   a plate-shaped body coupling the pair of cooling receiving portions together, the cooling receiving portions and the body being formed integrally with each other; and
   a cooling mechanism to cool the body,
   wherein the receiving spaces of the cooling receiving portions receive communication modules respectively, each of the communication modules including a respective substrate mounted with a respective communication circuit component thereon and respective one pair of sidewalls with the respective substrate located therebetween in a thickness direction of the respective substrate,
   wherein the receiving spaces of the cooling receiving portions each include an inner surface, and respective at least one sidewalls of the respective one pairs of sidewalls of the communication modules are in surface contact with the inner surfaces of the receiving spaces, respectively,
   wherein the heat sink includes a heat absorbing surface that absorbs heat from a processor located externally from the heat sink and the communication modules and that is electrically connected to the communication modules.

2. The communication module-cooling structure, according to claim 1, wherein the communication circuit components each include a respective optical element, which is optically coupled to an optical fiber, and a respective semiconductor circuit element, which is electrically connected to the respective optical element,
   wherein of the respective one pairs of sidewalls of the communication modules, at least respective sidewalls adjacent to the optical elements and the semiconductor circuit elements within the communication modules are in surface contact with the inner surfaces of the receiving spaces, respectively.

3. The communication module-cooling structure, according to claim 1, wherein the cooling mechanism includes a coolant passage, which faces the body of the heat sink, a pump for circulating coolant water to through the passage, and a radiator for cooling the coolant water.

4. The communication module-cooling structure, according to claim 1, wherein the communication circuit components each include a respective optical element, which is optically coupled to an optical fiber, and a respective semiconductor circuit element, which is electrically connected to the respective optical element,
   wherein the communication module-cooling structure further comprises a thermally conductive elastic member interposed between the inner surfaces of the receiving spaces and respective sidewalls apart from the optical elements and the semiconductor circuit elements within the communication modules, of the respective one pairs of sidewalls of the communication modules, respectively.

5. A communication module-cooling structure, comprising:
- a heat sink including a pair of cooling receiving portions each comprising partition walls and slit-shaped receiving spaces defined by the partition walls, and a plate-shaped body to couple the pair of cooling receiving portions together, the cooling receiving portions and the body being formed integrally with each other; and
- a cooling mechanism to cool the body,
- wherein the receiving spaces of the cooling receiving portions receive communication modules respectively, the communication modules each including a respective substrate mounted with a respective communication circuit component thereon and respective one pair of sidewalls with the respective substrate located therebetween in a thickness direction of the respective substrate,
- wherein the receiving spaces of the cooling receiving portions each include an inner surface, and respective at least one sidewalls of the respective one pairs of sidewalls of the communication modules are in surface contact with the inner surfaces of the receiving spaces, respectively,
- wherein the heat sink includes a heat absorbing surface to absorb heat from a processor being external to the communication modules and being electrically connected to the communication modules,
- wherein the communication module-cooling structure further comprises:
- a mother board to which the heat sink is fixed; and
- connectors to which the communication modules are mated, respectively,
- wherein the connectors are mounted on the mother board, and each of the receiving spaces is open in both directions at right angles to the mother board, and in one direction parallel to the mother board.

6. The communication module-cooling structure, according to claim 1, wherein the processor comprises a plate shaped semiconductor package substrate and an IC chip mounted on the semiconductor package substrate, and the semiconductor package substrate is mounted with connectors to which the communication modules are mated.

7. A communication module-cooling structure, comprising:
- a heat sink including a pair of cooling receiving portions each comprising partition walls and slit-shaped receiving spaces defined by the partition walls, and a plate-shaped body to couple the pair of cooling receiving portions together, the cooling receiving portions and the body being formed integrally with each other; and
- a cooling mechanism to cool the body,
- wherein the receiving spaces of the cooling receiving portions receive communication modules respectively, the communication modules each including a respective substrate mounted with a respective communication circuit component thereon and respective one pair of sidewalls with the respective substrate located therebetween in a thickness direction of the respective substrate,
- wherein the receiving spaces of the cooling receiving portions each include an inner surface, and respective at least one sidewalls of the respective one pairs of sidewalls of the communication modules are in surface contact with the inner surfaces of the receiving spaces, respectively,
- wherein the heat sink includes a heat absorbing surface to absorb heat from a processor being external to the communication modules and being electrically connected to the communication modules,
- wherein the communication circuit components each include a respective optical element which is optically coupled to an optical fiber, and a respective semiconductor circuit element which is electrically connected to the respective optical element,
- wherein of the respective one pairs of sidewalls of the communication modules, at least respective one sidewalls whose temperature rise resulting from heat evolution in the optical elements and the semiconductor circuit elements is large are in surface contact with the inner surfaces of the receiving spaces, respectively.

8. A communication device, comprising:
- a heat sink including a pair of cooling receiving portions each comprising partition walls and slit-shaped receiving spaces defined by the partition walls, and a plate-shaped body to couple the pair of cooling receiving portions together, the cooling receiving portions and the body being formed integrally with each other;
- a cooling mechanism to cool the body; and
- communication modules, each of which includes a respective substrate mounted with a respective communication circuit component thereon and respective one pair of sidewalls with the respective substrate located therebetween in a thickness direction of the respective substrate,
- wherein the receiving spaces of the cooling receiving portions receive the communication modules respectively, and each include an inner surface, and respective at least one sidewalls of the respective one pairs of sidewalls of the communication modules are in surface contact with the inner surfaces of the receiving spaces, respectively,
- wherein the heat sink includes a heat absorbing surface to absorb heat from a processor being external to the communication modules and being electrically connected to the communication modules.

* * * * *